(12) United States Patent
Li

(10) Patent No.: US 12,406,964 B2
(45) Date of Patent: Sep. 2, 2025

(54) CHIP PACKAGE AND METHOD OF FORMING CHIP PACKAGES

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 86 days.

(21) Appl. No.: 17/535,985

(22) Filed: Nov. 26, 2021

(65) Prior Publication Data

US 2022/0173074 A1    Jun. 2, 2022

(30) Foreign Application Priority Data

Nov. 27, 2020 (CN) .......................... 202011352636.4
Nov. 27, 2020 (CN) .......................... 202011352638.3
Nov. 27, 2020 (CN) .......................... 202011359780.0

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/568* (2013.01); *H01L 23/3128* (2013.01);
(Continued)

(58) Field of Classification Search
CPC ... H01L 25/0657; H01L 25/50; H01L 21/568; H01L 23/3128; H01L 23/5389;
(Continued)

(56) References Cited

U.S. PATENT DOCUMENTS

2010/0133704 A1   6/2010  Marimuthu et al.
2011/0024916 A1*  2/2011  Marimuthu ............ H01L 24/24
                                                  257/E21.511
(Continued)

FOREIGN PATENT DOCUMENTS

CN    101425510 A    5/2009
CN    104885217 A    5/2015
(Continued)

OTHER PUBLICATIONS

Shanghai Yibu Semiconductor Co., Ltd., First Office Action, CN 202011627702.4, Jul. 4, 2023, 7 pgs.
(Continued)

*Primary Examiner* — Timor Karimy
(74) *Attorney, Agent, or Firm* — USCH Law, PC

(57) ABSTRACT

A method of forming a package comprises forming a stack of chip layers on a carrier. The stack of chip layers including at least a first chip layer over the carrier and a second chip layer over the first chip layer. The first chip layer includes a plurality of first chips facing the carrier and a plurality of chip couplers. The second chip layer includes a plurality of second chips facing the first chip layer. The method further comprises encapsulating the stack of chip layers in a molding compound, removing the carrier to expose the front side of the first chip layer, forming a redistribution layer on the front side of the first chip layer and bumps on the redistribution layer, and dividing the stack of chips and the redistribution layer to form a plurality of the packages. A chip package thus formed include a stack of chips and one or more chip connectors on a singulated redistribution layer.

21 Claims, 4 Drawing Sheets

(51) Int. Cl.
  *H01L 23/00* (2006.01)
  *H01L 23/31* (2006.01)
  *H01L 23/538* (2006.01)
  *H01L 25/00* (2006.01)

(52) U.S. Cl.
  CPC .......... *H01L 23/5389* (2013.01); *H01L 24/13* (2013.01); *H01L 25/50* (2013.01); *H01L 2924/15311* (2013.01); *H01L 2924/181* (2013.01)

(58) Field of Classification Search
  CPC .......... H01L 24/13; H01L 2924/15311; H01L 2924/181; H10B 80/00
  See application file for complete search history.

(56) References Cited

U.S. PATENT DOCUMENTS

| | | |
|---|---|---|
| 2014/0225273 A1 | 8/2014 | Thacker et al. |
| 2015/0108661 A1 | 4/2015 | Vincent |
| 2015/0325509 A1* | 11/2015 | We .................. H01L 23/498 257/774 |
| 2017/0011993 A1 | 1/2017 | Zhao |
| 2017/0047308 A1 | 2/2017 | Ho et al. |
| 2019/0035761 A1 | 1/2019 | Goh et al. |
| 2019/0057940 A1* | 2/2019 | Cheah .................. H01L 25/50 |
| 2019/0067248 A1 | 2/2019 | Yoo |
| 2019/0088504 A1 | 3/2019 | Ho |
| 2020/0091123 A1 | 3/2020 | Sung |
| 2020/0203325 A1 | 6/2020 | Lee et al. |
| 2021/0125960 A1 | 4/2021 | Huang |

FOREIGN PATENT DOCUMENTS

| | | |
|---|---|---|
| CN | 104704631 A | 6/2015 |
| CN | 105118823 A | 12/2015 |
| CN | 106206458 A | 12/2016 |
| CN | 106463493 A | 2/2017 |
| CN | 107644871 A | 1/2018 |
| CN | 107818922 A | 3/2018 |
| CN | 110114874 A | 8/2019 |
| TW | 202032748 A | 9/2020 |
| TW | 202038354 A | 10/2020 |
| WO | WO2017160284 A1 | 9/2017 |

OTHER PUBLICATIONS

Shanghai Yibu Semiconductor Co., Ltd. First Office Action and Search Report, TW 110148083, Oct. 6, 2022, 12 pgs.
Weiping Li, U.S. Appl. No. 17/535,987, Non-Final Office Action issued Nov. 8, 2023.
Weiping Li, U.S. Appl. No. 17/535,984, Non-Final Office Action issued May 8, 2023.
Weiping Li, U.S. Appl. No. 17/535,984, Final Office Action issued Aug. 21, 2023.
Weiping Li, U.S. Appl. No. 17/535,984, Advisory Action dated Nov. 6, 2023.
Weiping Li, U.S. Appl. No. 17/535,984, Response to Non-Final Office Action issued Aug. 8, 2023.
Weiping Li, U.S. Appl. No. 17/535,984, Response to Final Office Action filed Oct. 23, 2023.
Weiping Li, U.S. Appl. No. 17/535,984, Examiner Interview Summary filed Nov. 3, 2023.
Weiping Li, U.S. Appl. No. 17/535,984, Notice of Allowance, issued Dec. 22, 2023.
Weiping Li, U.S. Appl. No. 17/566,661, Non-Final Office Action issued Nov. 22, 2023.
Shanghai Yibu Semiconductor Co., Ltd., First Office Action, CN 202011352636.4, Apr. 20, 2021, 12 pgs.
Shanghai Yibu Semiconductor Co., Ltd., Second Office Action, CN 202011352636.4, Jun. 8, 2021, 10 pgs.
Shanghai Yibu Semiconductor Co., Ltd., Third Office Action, CN 202011352636.4, Jul. 27, 2023 , 9 pgs.
Shanghai Yibu Semiconductor Co., Ltd., First Office Action, TW 110144187, Apr. 21, 2022, 7 pgs.
Shanghai Yibu Semiconductor Co., Ltd., First Office Action, KR 10-2021-0163984, Sep. 5, 2023, 6 pgs.
Yibu Semiconductor (Shanghai) Co., Ltd., First Office Action, CN 202011359780.0, Apr. 22, 2021, 11 pgs.
Yibu Semiconductor (Shanghai) Co., Ltd., English Translation of First Office Action, CN 202011359780.0, Apr. 22, 2021, 13 pgs.
Yibu Semiconductor (Shanghai) Co., Ltd., Second Office Action, CN 202011359780.0, Jun. 24, 2021, 8 pgs.
Yibu Semiconductor (Shanghai) Co., Ltd., English Translation of Second Office Action, CN 202011359780.0, Jun. 24, 2021, 14 pgs.
Yibu Semiconductor (Shanghai) Co., Ltd., CN Decision to Grant, CN 202011359780.0, Aug. 19, 2021, 4 pgs.
Yibu Semiconductor (Shanghai) Co., Ltd., English Translation of CN Decision to Grant, CN 202011359780.0, Aug. 19, 2021, 3 pgs.

* cited by examiner

CHIP PACKAGE AND METHOD OF FORMING CHIP PACKAGES

CROSS REFERENCE TO RELATED APPLICATIONS

This application claims the benefit of priority under the Paris Convention to Chinese Patent Application No. CN202011352636.4, filed Nov. 27, 2020, entitled "Package and Method of Forming the Package," Chinese Patent Application No. CN202011359780.0, filed Nov. 27, 2020, entitled "Package and Method of Forming the same," and Chinese Patent Application No. CN 202011352638.3, filed Nov. 27, 2020, entitled "Package and Method of Forming the Same," each of which is incorporated by reference herein in its entirety. This application is related to co-pending U.S. Patent Application entitled "Chip Package and Method of Forming the Same," filed on even date herewith, U.S. Patent Application entitled "Chip Package and Method of Forming," filed on even date herewith, each which is incorporated by reference herein in its entirety.

FIELD OF THE INVENTION

The present application relates to the technical field of semiconductors, in particular to chip packages and method of forming chip packages.

BACKGROUND

As the functions of semiconductor integrated circuits are ever increasing, and the computation speed gets faster and faster, more and more investment is made in the development of chip stacking technology to find more effective solutions. Wafer Level Packaging (WLP) is the technology of packaging an integrated circuit while it is still part of a wafer, in contrast to the more conventional method of slicing the wafer into individual circuits (dice) and then packaging them. WLP allows integration of wafer fab, packaging, test, and burn-in at wafer level in order to streamline the manufacturing process undergone by a device from silicon start to customer shipment. Current WLP technology, however, does not allow chip-stacking. Thus, in conventional chip stacking technology, stacking is mostly carried out in final assembly, and vertical connection between stacked chips needs to be realized using technologies such as Through Silicon Via (TSV), Through Glass Via (TGV), Through Mold Via (TMV), or Wire-bond (Wire-bond). As a result, the packaging process of conventional chip-stacking techniques is complicated and costly.

SUMMARY

In some embodiments, a chip packaging method comprising forming a stack of chip layers on a carrier substrate. The stack of chip layers includes at least a first chip layer formed on the carrier substrate and a second chip layer assembled on the first chip layer. The first chip layer as a front side facing the carrier substrate and includes a plurality of first chips having first chip contacts on the front side of the first chip layer, and a first plurality of chip couplers having through vias extending between the front side and the back side of the first chip layer. The second chip layer has a front side facing the first chip layer and includes a plurality of second chips having second chip contacts on the front side of the second chip layer.

The chip packaging method further comprises encapsulating the stack of chip layers in a molding compound to form an encapsulated chip stack, removing the carrier substrate to expose the front side of the first chip layer, forming a redistribution layer on the front side of the first chip layer, and dividing a package main body including the encapsulated chip stack and the redistribution layer to form a plurality of packages.

In some embodiments, a package of the plurality of packages includes a singulated redistribution layer, a stack of chips coupled to the singulated redistribution layer, and one or more first chip connector devices having through vias. In some embodiments, the stack of chips includes one or more first chips and one or more second chips. A respective first chip of the one or more first chips has respective first chip contacts coupled to the singulated redistribution layer. A respective second chip of the one or more second chips has respective second chip contacts coupled to the singulated redistribution layer via at least some of the through vias in the one or more first chip connector devices. The one or more first chip connector devices include at least one chip coupler and/or at least one chip coupler segment from the first plurality of chip couplers.

In some embodiments, each of the plurality of second chips is assembled on one or more first chips of the plurality of first chips and one or more chip couplers of the first plurality of chip couplers.

In some embodiments, the first plurality of chip couplers include first coupler contacts on the front side of the first chip layer and second coupler contacts on the back side of the first chip layer, and the second chip layer is assembled on the first chip layer by coupling respective second chip contacts to corresponding ones of the second coupler contacts.

In some embodiments, the first plurality of chip couplers include active and/or passive coupling devices.

In some embodiments, the stack of chip layers further includes a third chip layer assembled on the second chip layer, which includes a second plurality of chip couplers, and the third chip layer has a front side facing the second chip layer and includes a plurality of third chips having third chip contacts on the front side of the third chip layer. In some embodiments, the package of the plurality of packages further includes at least one third chip coupled to the singulated redistribution layer via at least one second chip connector device, the at least one second chip connector device including at least one chip coupler and/or at least one chip coupler segment from the second plurality of chip couplers.

In some embodiments, the first and second plurality of chip couplers include active and/or passive coupling devices.

In some embodiments, the at least one second chip connector device includes third coupler contacts coupled to the singulated redistribution layer, fourth coupler contacts coupled to the at least one third chip, and through vias between the third coupler contacts and respective ones of the fourth coupler contacts.

In some embodiments, the at least one second chip connector device includes fifth coupler contacts coupled to the at least one first chip connector, sixth coupler contacts coupled to the at least one third chip, and through vias between the fifth coupler contacts and respective ones of the sixth coupler contacts.

In some embodiments, each respective second chip is assembled on one or more corresponding first chips of the plurality of first chips and one or more corresponding chip couplers of the first plurality of chip couplers, each respective chip coupler of the second plurality of chip couplers is assembled on one or more corresponding chip couplers of the first plurality of chip couplers; and each third chip is assembled on one or more corresponding second chips of the plurality of second chips and on one or more chip couplers of the second plurality of chip couplers.

In some embodiments, the first plurality of chip couplers include first chip couplers of a first height and the second plurality of chip couplers include second chip couplers of a second height greater than the first height, and each third chip is assembled on one or more corresponding second chips of the plurality of second chips and one or more corresponding second chip couplers of the second height.

According to some embodiments, a chip package comprises a redistribution circuit, a stack of chips coupled to the redistribution circuit, the stack of chips including one or more first chips and one or more second chips, and one or more first chip connectors having through vias. In some embodiments, a respective first chip of the one or more first chips has respective first chip contacts coupled to the redistribution circuit; and a respective second chip of the one or more second chips has respective second chip contacts coupled to the redistribution circuit via at least some of the through vias in the one or more first chip connectors.

In some embodiments, the one or more first chip connectors include active and/or passive coupling devices.

In some embodiments, the one or more first chip connectors include one or more first chip connectors of a first height and one or more first chip connectors of a second height greater than the first height, and the respective second chip contacts are coupled to the redistribution circuit via the one or more first chip connectors of the first height. In some embodiments, the stack of chips further includes a respective third chip having third chip contacts coupled to the redistribution circuit via the one or more first chip connectors of the second height.

In some embodiments, the chip package further includes one or more second chip connectors having through vias, and the stack of chips further includes a third chip having third chip contacts coupled to the redistribution circuit via at least some of the through vias in the one or more second chip connectors and some of the vias in the one or more first chip connectors.

In some embodiments, the one or more second chip connectors include active and/or passive coupling devices.

In some embodiments, the one or more first chip connectors include surface traces, and the third chip is coupled to the respective second chip via the one or more second chip connectors and the surface traces.

In some embodiments, the one or more second chip connectors and the one or more first chip connectors form one or more chip connector stacks.

In some embodiments, each of the one or more second chip connectors is smaller in size from any of the one or more first chip connectors.

The embodiments described herein realize the stacking of the chips by using chip connector and a one-stop WLP process, without using the technology of vertically connecting the chips using TSVs and the like in the functional chips. Thus, the complexity and manufacturing cost of the three-dimensional multi-layer chip package is reduced.

The foregoing description is only an overview of the technical solutions of the present invention, and the embodiments of the present invention are described below in order to make the technical means of the present invention more clearly understood and to make the above and other objects, features, and advantages of the present invention more clearly understandable.

BRIEF DESCRIPTION OF THE DRAWINGS

The above and other objects, features and advantages of exemplary embodiments will become readily apparent from the following detailed description read in conjunction with the accompanying drawings. Several embodiments are illustrated by way of example, and not by way of limitation, in the figures of the accompanying drawings and in which the same or corresponding reference numerals indicate the same or corresponding parts.

FIGS. 6 to 8A are schematic cross-sectional views of a package being formed in a process for forming a package according to some embodiments.

DETAILED DESCRIPTION OF THE EMBODIMENTS

Figure 1:
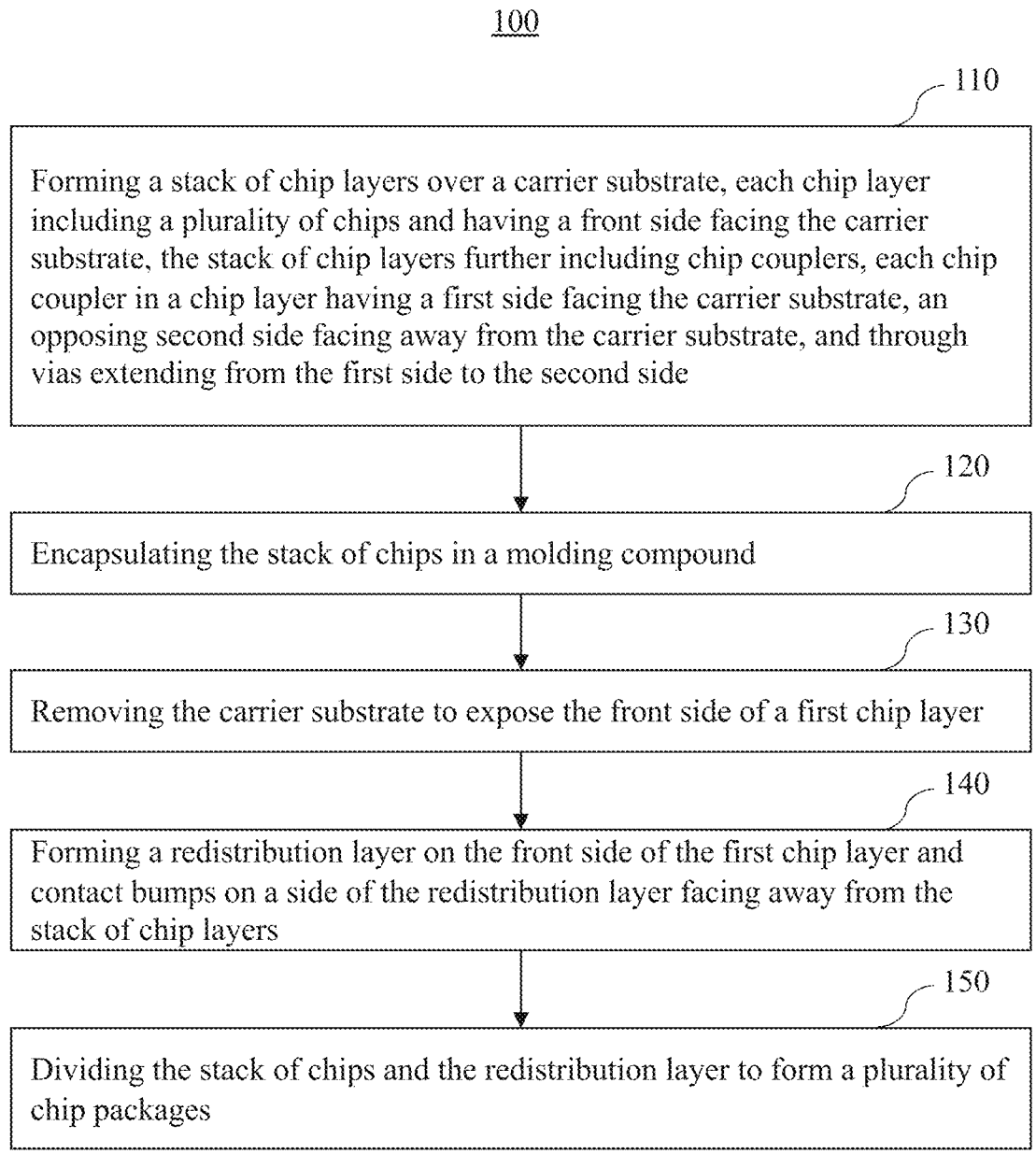
FIG. 1 shows a flow diagram of a method for forming a package according to some embodiments.

The following disclosure provides various embodiments, or examples, for implementing various features or solutions. Specific examples of components and arrangements are described below to simplify the present disclosure. These are, of course, merely examples and are not intended to limit the invention. For example, in the following description, forming a first feature over or on a second feature may include embodiments in which the first and second features are formed in direct contact, and may also include embodiments in which additional features may be formed between the first and second features, such that the first and second features may not be in direct contact. Further, the present invention may repeat reference numerals and/or characters in the various embodiments. This repetition is for the purpose of simplicity and clarity and does not in itself dictate a relationship between the various embodiments and/or configurations discussed.

FIG. 1 shows a flow diagram illustrating a method 100 of forming a package according to an embodiment. The method 100 comprises: Step 110, in which a stack of chip layers is formed on a carrier or carrier substrate. Each chip layer includes a plurality of chips and has a front side facing the carrier substrate. The stack of chip layers further includes chip couplers. Each chip coupler in a chip layer has a first side facing the carrier substrate, an opposing second side facing away from the carrier substrate, and through vias extending from the first side to the second side. The method 100 further comprises Step 120, in which a molding process is performed to encapsulate the stack of chip layers in a molding compound; Step 130, in which the carrier is removed to expose the front side of a first chip layer; Step 140, in which a redistribution or rewiring layer is formed on the exposed front side of the first chip layer and, afterwards, solder bumps are formed on a side of the redistribution layer facing away from the stack of chip layers; and Step 150, in which the stack of chips together with the redistribution layers is divided (or singulated) to form a plurality of packages.

In some embodiments, the carrier is a high surface flatness component, and at least one chip layer may be stacked on the carrier. After the molding process is performed on the chip layer, a molded package structure may be formed on the carrier. In some embodiments, the material used for the molding process may include solid or liquid molding materials starting from epoxy resins, organic polymers, or other compounds with or without silicon-based or glass fillers.

In some embodiments, the step of removing the carrier, the step of adding the rewiring layer and the bumps, and the step of dividing the package body are steps known in Wafer Level Packaging (WLP).

Various embodiments of the present invention will be described below based on the above-described method and with reference to various figures.

FIGS. 2A-2C and 3A to 3B show schematic cross-sectional views, layout views and perspective views of various stages a package being formed in process for forming a package according to some embodiments.

Figure 2A:
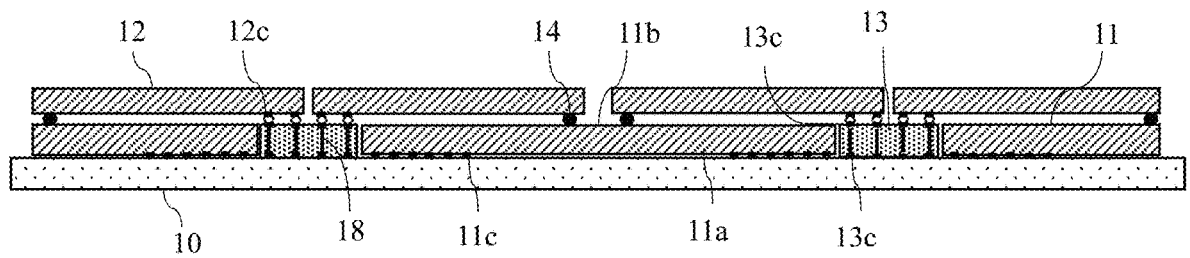
FIGS. 2A-2C and 3A to 3B show schematic cross-sectional views, layout views and perspective views of various stages a package being formed in process for forming a package according to some embodiments.

As shown in FIG. 2A, after performing steps 110 and 120, a stack of (e.g., two) chip layers are placed and assembled on a carrier 10. The stack of chip layers including a first chip layer adjacent the carrier 10 and a second chip layer adjacent the first chip layer. The first chip layer includes a plurality of first chips 11 and a plurality of chip couplers 13. The second chip layer includes a plurality of second chips 12.

Figure 2B:
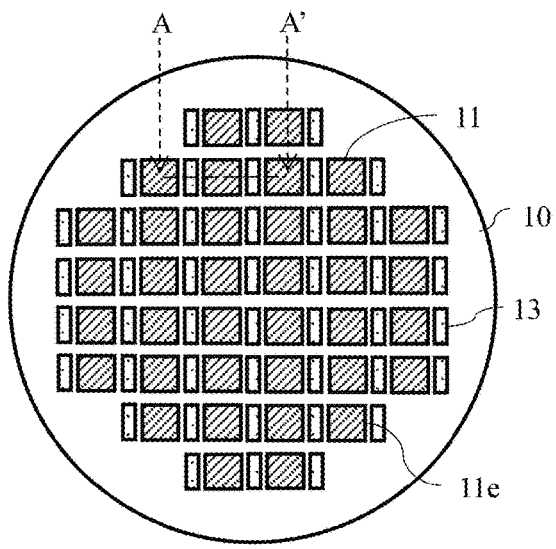

FIG. 2B is a layout view of the first chip layer on the carrier 10, with dashed line A-A' indicating where the cross-section of FIG. 2A is taken. As shown in FIG. 2B, the first chip 11 and the chip connectors 13 may be first placed on the carrier 10 at their respective positions. The first chips 11 and the chip couplers 13 in the first chip layer are spread horizontally across a flat surface of the carrier 10, with each chip coupler 13 in the bottom chip layer placed next to at least one neighboring first chip 11, and each first chip 11 being flanked by one or more corresponding chip coupler(s) 13. FIG. 2B also shows that the first chips 11 are placed on the carrier facing down with its back surface facing away from the carrier 10, according to some embodiments.

In some embodiments, a chip layer can be formed such that each chip is flanked on all four sides or edges by four chip couplers, respectively, so as to accommodate more I/O contacts on the chips.

Figure 2C:
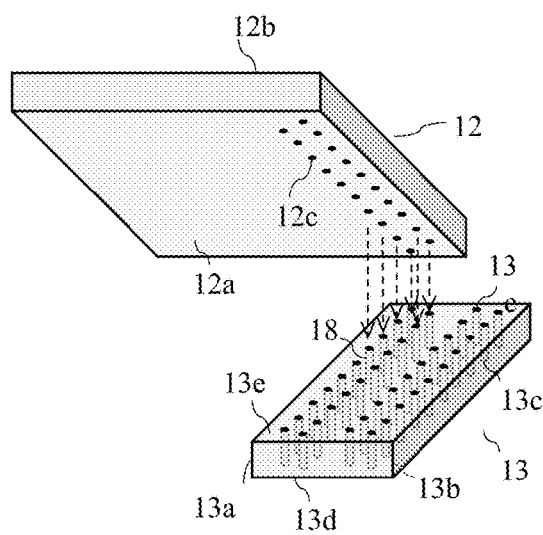

After the first chip layer is formed, each second chip 12 may be placed and assembled on a corresponding first chip 11 and one or more corresponding chip connectors 13. FIG. 2C is a perspective view of a chip coupler 13 and a second chip 12 showing the placing and assembling of the second chip 12 on the chip coupler 13. As shown in FIG. 2C, the second chip 12 has a front side or surface 12a and an opposing back side 12b, and the front surface 12a of the second chip 12 has contact pads or bumps 12c arranged proximate to an edge 12e of the second chip 12. As also shown in FIG. 2C, in some embodiments, the chip coupler 13 has four edges (including a left edge 13a, a right edge 13b), a first (bottom) side or surface 13d and a second (top) side or surface 13e. The chip coupler 13 further includes first contact pads or bumps 13c on the bottom surface 13d and second contact pads or bumps 13c on the top surface 13e, and through vias 18 coupling respective first contact pads to respective bottom contact pads.

As shown by the dashed arrows in FIG. 2C, forming the stack of chips may include aligning and coupling (electrically and/or mechanically) the contact pads of bumps 12c on the front side of chip 12 to corresponding contacts 13c on the top surface 13e of chip coupler 13. In some embodiments, the contact pads of bumps 12c on the front side of chip 12 are coupled to corresponding contacts 13c on the top surface 13e of chip coupler 13 using a soldering process. In some embodiments, each of the second chips 12 is placed and assembled with its contact pads or bumps 11c, 12c mechanically and electrically coupled to a subset of the chip coupler contacts 13c on a top surface 13e of a chip coupler 13 by, for example, soldering.

Herein, a chip connector may be used to electrically couple different electronic devices, including, for example, various devices such as chips, redistribution layers, and other chip connectors; the electronic device to which the chip connector is coupled is typically not in the same chip layer as the chip connector. In some embodiments, the chip couplers may be made of a material such as glass or silicon. In some embodiments, the chip couplers may be active or passive coupling devices. For example, the chip coupler may have several through holes 18 in the vertical direction. The hole 18 may be filled with a conductive material to form a conductive via 18. In some embodiments, conductive traces may be provided on both the upper and lower surfaces of the chip connector to electrically couple different vias on one surface.

Adhesive dots (adhesive dots) or spacers may also be provided between the different chip layers, such as adhesive dots 14 shown in FIG. 2A. The adhesive dots serve to separate and secure the different chip layers. In some embodiments, the adhesive dots are made of a non-conductive medium. In some embodiments, adhesive dots may be omitted.

Figure 3A:
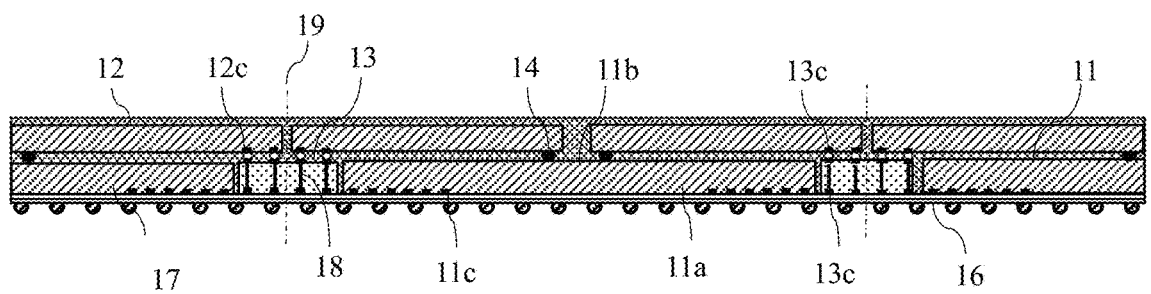

FIG. 3A shows a package main body after steps 130 and 140 are performed.

As shown in FIG. 3A, the stack of chip layers are molded, thereby forming a mold structure 15. After removing the carrier 10, a redistribution or rewiring layer 16 may be formed on the front side of the first chip layer, and bumps 17 may be formed on the rewiring layer 16.

Figure 3B:
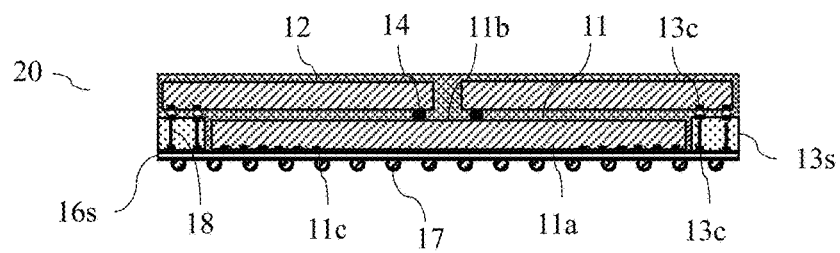

FIG. 3B shows a package 20 formed after performing step 150. As shown, the package 20 includes a singulated redistribution layer 16s, a stack of chips coupled to the singulated redistribution layer 16s, and one or more (e.g., two) first chip connector devices 13s having respective through vias. The stack of chips includes one or more first chips 11 and one or more second chips 12. A respective first chip 11 of the one or more first chips has a front side 11a facing the redistribution layer 16s and respective first chip contacts 11c on the front side of the respective first chip 11 and coupled to the singulated redistribution layer 16s. A respective second chip 12 of the one or more second chips has a front side 12a (shown in FIG. 2C) facing the backside 11b of the first chip 11 and respective second chip contacts 12c (shown in FIG. 2C) on the front side 12a of the respective second chip 12. The respective second chip contacts are coupled to the singulated redistribution layer 16s via at least some of the respective through vias in the one or more first chip connector devices 13s.

In some embodiments, the one or more first chip connector devices 13s in the package include at least one chip coupler 13 and/or at least one chip coupler segment from the first plurality of chip couplers. For example, as the mold structure 15 is cut along lines 19, a chip coupler 13 may be segmented into two chip coupler segments, one in each of the packages on two sides of a cut line 19, and each chip coupler segment is a chip connector device 13s.

As shown in FIG. 3B, for example, the package 20 can include two segmented chip connectors 13s, two second chips 12 and one first chip 11. The two second chips 12 can be electrically coupled to the first chip 11 through the two chip coupler segments 13s respectively, and the singulated portion 16s of the redistribution layer 16.

Figure 4:
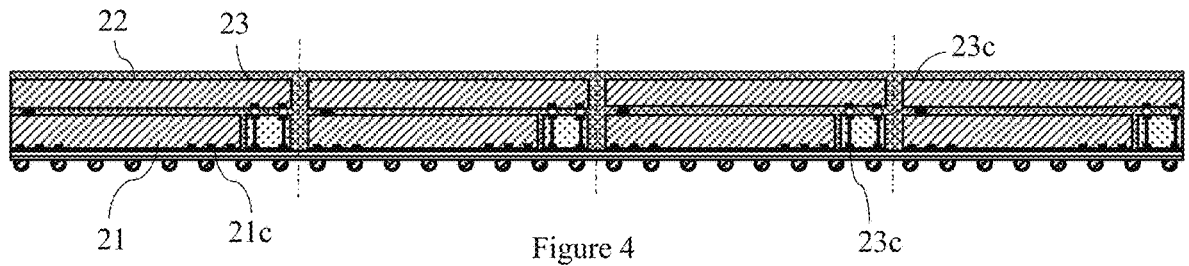
FIGS. 4 to 5 show schematic cross-sectional views of a package being formed in a process for forming a package according to some embodiments.
Figure 5:
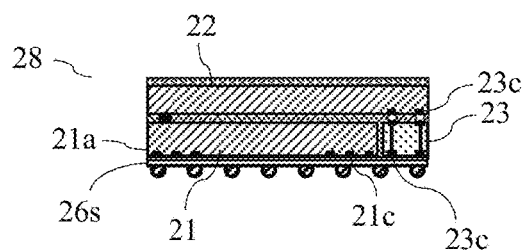

FIGS. 4 to 5 show schematic cross-sectional views of a package at different stages of a process for forming the package according to some embodiments.

FIG. 4 shows a package main body after steps 130 and 140 are performed. The package main body including a stack of chip layers encapsulated in a molding compound and a redistribution layer formed on the front side of a first chip layer. The first chip layer including a plurality of first chips 21 and a plurality of chip connectors 23 each having through vias 23 and chip connector contacts 23c on opposite ends of the through vias 23. A second chip layer is formed on the first chip layer and includes a plurality of second chips 22.

FIG. 5 shows a package 28 after performing step 150.

The package 28 includes a chip connector 23, a second chip 22, and a first chip 21. The second chip 22 can be electrically coupled to the first chip 21 through the chip coupler 23 and a singulated redistribution layer 26s.

FIGS. 6 to 8A show schematic cross-sectional views of a package at different stages of a process for forming the package according to some embodiments.

Figure 6:
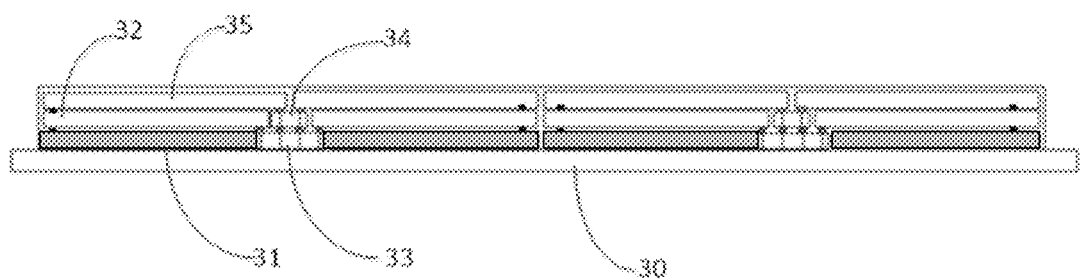

As shown in FIG. 6, three chip layers are formed on a carrier 30. The first chip layer includes a plurality of first chips 31 and a plurality of first chip couplers 33. The second chip layer includes a plurality of second chips 32 and a plurality of second chip couplers 34. The third chip layer includes a plurality of third chips 35.

In some embodiments, the plurality of first chips 31 and the plurality of first chip couplers 33 are first placed on the carrier 10, then the plurality of second chips 32 and the plurality of second chip couplers 34 on the first chips 11 and the chip couplers 33, and finally the plurality of third chips 35 on the plurality of second chips 32 and the plurality of second chip couplers 34. In some embodiments, the first chips 31, the second chips 32, and the third chips 35 are placed face down (e.g., with the front side facing the carrier).

In some embodiments, the package structure as shown in FIGS. 6 to 8A may comprise one or more second chip layers. Each of the one or more second chip layers includes a plurality of second chips and a plurality of second chip couplers. Thus, one or more second chip couplers may be stacked on the first chip coupler 33 to form a chip coupler stack. In some embodiments, in a chip coupler stack, the area of a top surface or bottom surface of a chip coupler in one chip layer may be different from the area of a top surface or bottom surface of a chip coupler in a different chip layer. For example, as shown in FIG. 6, the chip coupler 34 stacked over the chip coupler 33 has a smaller horizontal size than the chip coupler 33. In this way, portions of the chip coupler 33 would protrude beyond the left and right edges of the chip coupler 34 to allow coupling of the second chips 22 on the left and right sides of the chip coupler 34 to some of the vias in the chip coupler 33.

Figure 7:
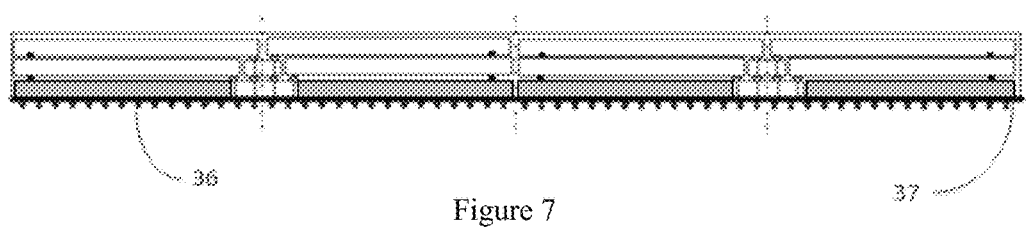

FIG. 7 shows a package main body after steps 130 and 140 are performed. As shown in FIG. 7, three chip layers are molded to form an encapsulated structure. After removing the carrier 30, a rewiring layer 36 may be added under the package body, and a bump 37 may be added under the rewiring layer 36.

Figure 8A:
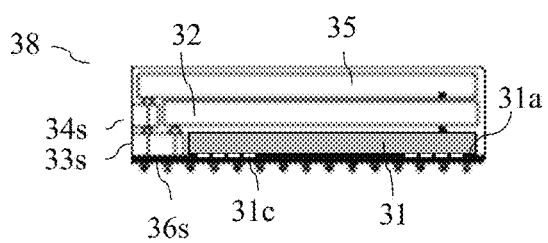

FIG. 8A shows a package 38 after performing step 150. As shown, the package 38 includes a singulated redistribution layer 36s, a stack of chips coupled to the singulated redistribution layer 36s, and one or more chip connector stacks. The stack of chips includes one or more first chips 31, one or more second chips 32, and one or more third chips 35. The one or more chip connector stacks including stacked chip connector devices (e.g., first connector device 33s and second connector device 34s) having respective through vias. A respective first chip 31 of the one or more first chips has a front side 31a facing the singulated redistribution layer 36s and respective first chip contacts 31c on the front side of the respective first chip and coupled to the singulated redistribution layer 36s. A respective second chip 32 of the one or more second chips has a front side facing the one or more first chips 31 and respective second chip contacts on the front side of the respective second chip. The respective second chip contacts are coupled to the singulated redistribution layer 36s via at least some of the respective through vias in the one or more first chip connector devices 33s. A respective third chip 35 of the one or more third chips has a front side facing the one or more second chips and respective third chip contacts on the front side of the respective third chip. The respective third chip contacts are coupled to the singulated redistribution layer 36s via at least some of the respective through vias in the one or more second chip connector devices 34s.

In some embodiments, a first chip connector device 33s may be a segment of a first chip coupler 33, and a second chip connector device 34s may be a segment of a second chip coupler 34. In some embodiments, the package 38 may include a segmented first chip coupler, at least one segmented second chip coupler, a third chip, at least one second chip, and a first chip.

Figure 8B:
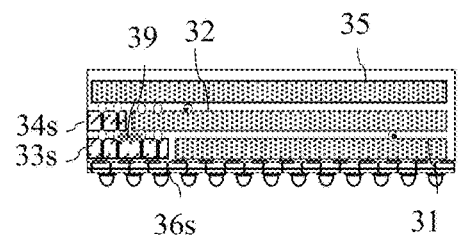
FIG. 8B is a schematic cross-sectional view of a package including one or more chip connectors with conductive traces on one or more surfaces thereof according to some embodiments

In some embodiments, conductive traces 39 may be provided on, for example, the top surface of a first chip connector device 33, so as to allow the third chip 35 be electrically coupled to the at least one second chip 32 in the package 38 through the at least one second chip connector device 34s and the first chip connector device 33s, as shown in FIG. 8B. The third chip may be further electrically coupled to the first chip through at least one second chip connector device 34s, the first chip connector device 33s, and the singulated redistribution layer 36s. The at least one second chip may be electrically coupled to the first chip through the first chip connector device 33s and the singulated redistribution layer 36s, or the at least one second chip may be electrically coupled to the first chip through the at least one second chip connector device 34s, the first chip connector device 33s, and the singulated redistribution layer 36s.

Figure 9:
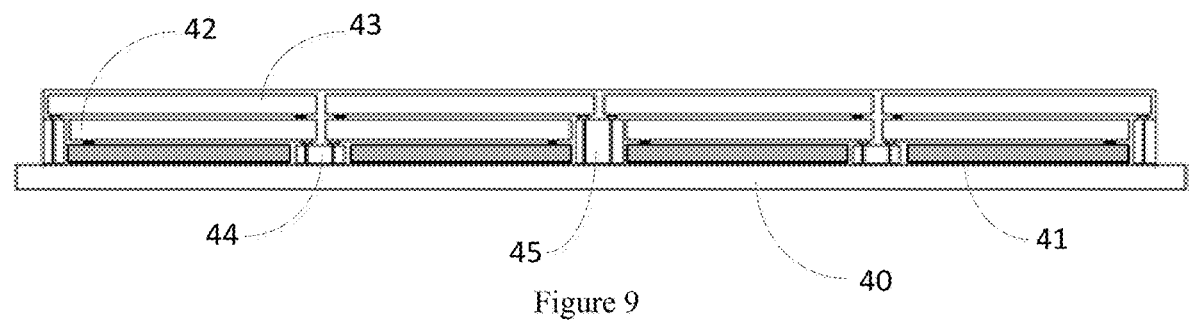
FIGS. 9 to 11 are schematic cross-sectional views of a package being formed in a process for forming a package according to some embodiments.
Figure 10:
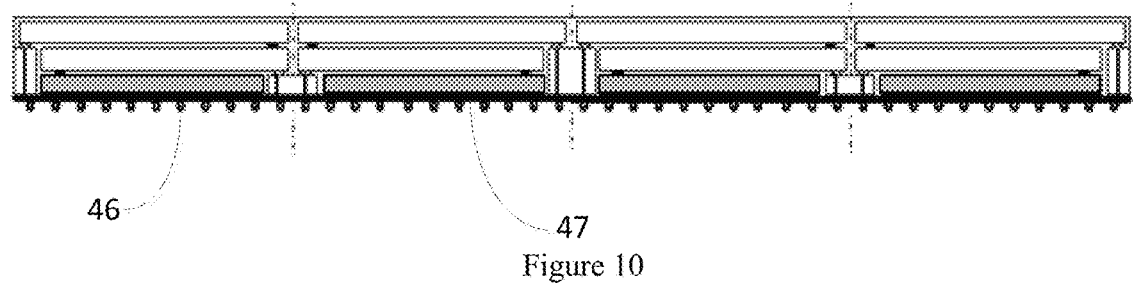
Figure 11:
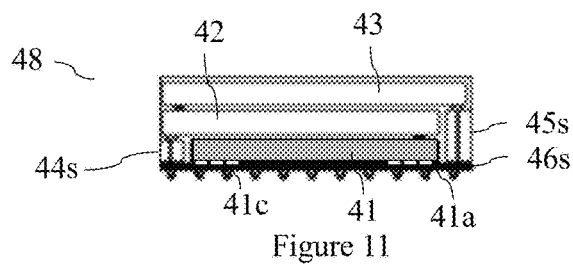

FIGS. 9 to 11 show schematic cross-sectional views of a package at different stages of a process for forming the package according to some embodiments.

As shown in FIG. 9, three chip layers are formed on the carrier 40. The first chip layer comprises a plurality of first chips 41, a plurality of first chip couplers 44, a plurality of cross-layer chip couplers 45, wherein the thickness of the cross-layer chip couplers 45 exceeds that of at least one chip layer. The second chip layer includes a plurality of second chips 42. The third chip layer includes a plurality of third chips 43. In some embodiments, the cross-layer chip coupler 45 may be a plurality of chip couplers stacked together, or may be an integrally formed chip coupler. In some embodiments, in the case where a plurality of chip couplers are stacked together, the area of each of the chip couplers in the horizontal direction may be the same or different. In some embodiments, where the cross-layer chip couplers are integrally formed, the cross-layer chip couplers may have a stepped shape, a rectangular cross-sectional shape, a pyramidal cross-sectional shape, or other cross-sectional shapes.

The plurality of first chips 41, the plurality of cross-layer chip couplers 45, and the plurality of first chip couplers 44 may be first placed on carrier 40, then second plurality of chips 42 may be placed and assembled on the plurality of first chips 41 and the plurality of first chip couplers 44, and finally the plurality of third chips 43 may be placed and assembled on the second plurality of chips 42 and the cross-layer chip couplers 45. In some embodiments, first chip 41, second chip 42, and third chip 43 are placed face down.

In some embodiments, the package structure as shown in FIGS. 9 to 11 may comprise a plurality of second chip layers. Each of the plurality of second chip layers includes a plurality of second chips and may further include a plurality of second chip couplers. A plurality of layers of second chip connectors may be stacked on the first chip connectors 44. In some embodiments, the area of each layer of chip couplers in the horizontal direction may not be exactly the same in the stack formed by the layers of second chip couplers and first chip couplers 44. For example, in the stack formed by the plurality of layers of the second chip connectors and the first chip connectors 44, the area of the chip connectors in any one layer in the horizontal direction may be smaller or larger than the area of the chip connectors below the chip connectors in the horizontal direction.

FIG. 10 shows the structure of the package main body after steps 130 and 140 are performed.

As shown in FIG. 10, three chip layers are molded to form an encapsulated structure. After removing carrier 40, a redistribution layer 46 may be added under the package body, and bumps 47 may be added under redistribution layer 46.

FIG. 11 shows a package 48 after performing step 150.

The package 48 may include a segmented first chip coupler 44s, a segmented cross-layer chip coupler 45s, a singulated redistribution layer 46s, a third chip 43, a second chip 42, and a first chip 41. In some embodiments, the package 48 may include a segmented first chip coupler 44s, at least one segmented second chip coupler (not shown), a segmented cross-layer chip coupler 45s, a third chip 43, at least one second chip 42, and a first chip 41

The at least one second chip may be electrically coupled to the first chip through the divided first chip connector and the re-wiring layer, or the at least one second chip may be electrically coupled to the first chip through the at least one divided second chip connector, the divided first chip connector and the re-wiring layer. The third chip may be electrically coupled to the at least one second chip through the divided cross-layer chip connector, the re-wiring layer, the divided first chip connector, and the at least one divided second chip connector, or the third chip may be electrically coupled to the at least one second chip through the divided cross-layer chip connector, the re-wiring layer, and the divided first chip connector. The third chip may be electrically coupled to the first chip through the split cross-layer chip coupler and the rewiring layer.

Figure 12:
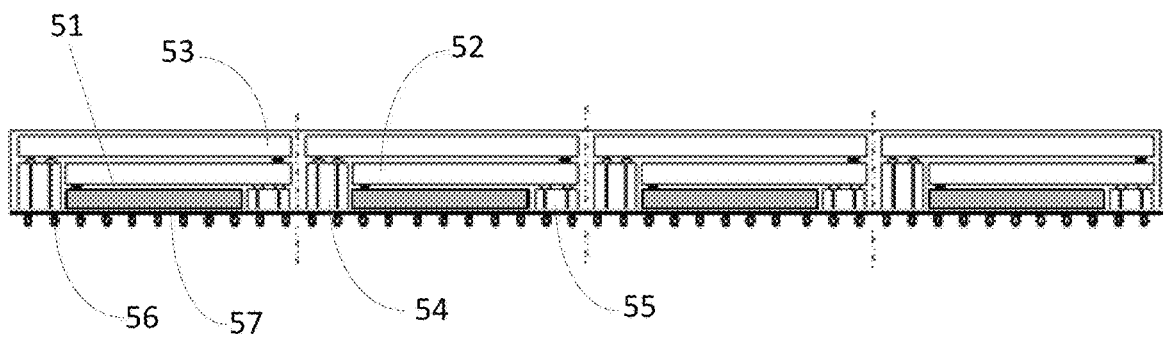
FIGS. 12 to 13 are schematic cross-sectional views of a package being formed in a process for forming a package according to some embodiments.
Figure 13:
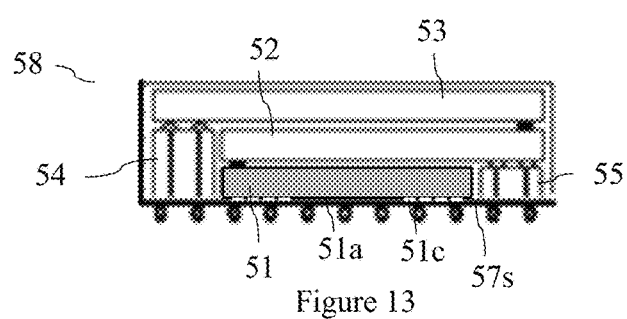

FIGS. 12 to 13 show schematic cross-sectional views of a package at different stages of a process for forming the package according to some embodiments.

FIG. 12 shows a package main body after steps 130 and 140 are performed. As shown in FIG. 12, the chip layer of the package main body is molded, thereby forming a mold structure. The package body includes three chip layers, a plurality of bumps 56, and a rewiring layer 57. The first chip layer includes a plurality of first chips 51, a plurality of first chip couplers 55, a plurality of cross-layer chip couplers 54, wherein the thickness of the cross-layer chip couplers 54 exceeds at least one chip layer. The second chip layer includes a plurality of second chips 52. The third chip layer includes a plurality of third chips 53. In some embodiments, in the case where a plurality of chip couplers are stacked together, the area of each of the chip couplers in the horizontal direction may be the same or different. In some embodiments, where the cross-layer chip couplers are integrally formed, the cross-layer chip couplers may have a stepped shape, a pyramidal shape, or other shapes.

First, the plurality of first chips 51, the plurality of cross-layer chip connectors 54, and the plurality of first chip connectors 55 may be placed on the carrier, then the plurality of second chips 52 may be placed and assembled on the plurality of first chips 51 and the plurality of first chip connectors 55, and finally the plurality of third chips 53 may be placed and assembled on the plurality of second chips 52 and the plurality of cross-layer chip connectors 54. In some embodiments, first chip 51, second chip 52, and third chip 53 are placed face down.

In some embodiments, the package structure as shown in FIGS. 12 to 13 may comprise a plurality of second chip layers. Each of the plurality of second chip layers includes a plurality of second chips and a plurality of second chip couplers. A plurality of layers of second chip connectors may be stacked on the first chip connectors 55. In some embodiments, the area of each layer of chip couplers in the horizontal direction may not be exactly the same in the stack formed by the layers of the second chip couplers and the first chip couplers 55. For example, in the stack formed by the plurality of layers of the second chip connectors and the first chip connectors 55, the area of the chip connectors in any one layer in the horizontal direction may be smaller or larger than the area of the chip connectors below the chip connectors in the horizontal direction.

FIG. 13 shows a package 58 after performing step 150.

The package 58 may include a first chip connector 55, a cross-layer chip connector 54, a third chip 53, a second chip 52, and a first chip 51. In some embodiments, the package 58 may include a first chip coupler 55, at least one second chip coupler (not shown), a cross-layer chip coupler 54, a third chip 53, at least one second chip 52, and a first chip 51.

The at least one second chip 52 may be electrically coupled to the first chip 51 through the first chip coupler 55 and a singulated redistribution layer 57s, or the at least one second chip 52 may be electrically coupled to the first chip 51 through the at least one second chip coupler (not shown), the first chip coupler 55 and the singulated redistribution layer 57s. The third chip 53 may be electrically coupled to the at least one second chip 52 by the cross-layer chip connector 54, the singulated redistribution layer 57s, the first chip connector 55, and the at least one second chip connector, or the third chip 53 may be electrically coupled to the at least one second chip 52 by the cross-layer chip connector 54, the singulated redistribution layer 57s, and the first chip connector 54. The third chip 53 may be electrically coupled to the first chip 51 by a cross-layer chip coupler 54 and the singulated redistribution layer 57s.

Therefore, according to some embodiments, A chip packaging method comprises placing a first chip layer on a carrier substrate with a front side of the first chip layer facing the carrier substrate and a back side of the first chip layer facing away from the carrier substrate, the first chip layer including a plurality of first chips 11, 21, 31, 41, 51 having first chip contacts on the front side of the first chip layer, the first chip layer further including a first plurality of chip couplers 13, 23, 33, 44, 45, 54, 55. The method further comprises assembling a second chip layer on the back side of the first chip layer with a front side of the second chip layer facing the first chip layer and a back side of the second chip layer facing away from the first chip layer, the second chip layer including a plurality of second chips 12, 22, 32, 42 having second chip contacts on the front side of the second chip layer.

The method further comprises encapsulating the first chip layer and the second chip layer on the carrier substrate in a molding compound, removing the carrier substrate to form a packaging main body including at least the first chip layer and the second chip layer encapsulated in the molding compound, forming a redistribution layer on the front side of the first chip layer, and dividing the package main body to form a plurality of packages. In some embodiments, a package of the plurality of packages including at least one first chip 11, 21, 31, 41, 51 from the first chip layer coupled to at least one second chip from the second chip layer via a singulated redistribution layer and at least one first chip connector 13, 23, 33, 44, 55, the at least one first chip connector 13, 23, 33, 44, 55 including at least one chip coupler or at least one chip coupler segment from the first chip layer.

In some embodiments, assembling the second chip layer on the back side of the first chip layer includes assembling a second chip 12, 22, 32, 42 on one or more first chips of the plurality of first chips 11, 21, 31, 41, 51 and one or more chip couplers 13, 23, 33, 44, 55 of the plurality of chip couplers.

In some embodiments, the at least one first chip coupler 13, 23, 33, 44, 55 includes first coupler contacts coupled to the singulated redistribution layer, second coupler contacts coupled to the at least one second chip 12, 22, 32, 42, and through vias between the first coupler contacts and respective ones of the second coupler contacts.

In some embodiments, the first plurality of chip couplers 13, 23, 33, 44, 45, 54, 55 include active and/or passive coupling devices.

In some embodiments, after assembling the second chip layer on the first chip layer and before encapsulating the first chip layer and the second chip layer, the method further comprises assembling a third chip layer on the back side of the second chip layer with a front side of the third chip layer facing the second chip layer and a back side of the third chip layer facing away from the second chip layer, the third chip layer including a plurality of third chips 35, 43, 53 having third chip contacts on the front side of the third chip layer.

In some embodiments, encapsulating the first chip layer and the second chip layer on the carrier substrate includes encapsulating the third chip layer with the first chip layer and the second chip layer in the molding compound. Thus, the package main body further includes the third chip layer encapsulated with the first chip layer and the second chip layer in the molding compound.

In some embodiments, the package of the plurality of packages further includes at least one third chip 35, 43, 53 coupled to the singulated redistribution layer via at least one second chip connector 33, 34, 45, 54, the at least one second chip connector 33, 34, 45, 54 including at least one chip coupler or at least one chip coupler segment from at least the first chip layer.

In some embodiments, the at least one second chip connector 33, 34, 45, 54 includes third coupler contacts coupled to the singulated redistribution layer, fourth coupler contacts coupled to the at least one third chip 35, 43, 53, and through vias between the third coupler contacts and respective ones of the fourth coupler contacts.

In some embodiments, the at least one second chip connector 34, 45, 54 includes fifth coupler contacts coupled to the at least one first chip connector 33, sixth coupler contacts coupled to the at least one third chip 35, 43, 53, and through vias between the fifth coupler contacts and respective ones of the sixth coupler contacts.

In some embodiments, the second chip layer further includes a second plurality of chip couplers 34. Thus, assembling the second chip layer on the back side of the first chip layer includes assembling a second chip 12, 22, 32, 42 on one or more first chips 11, 21, 31, 41, 51 of the plurality of first chips 11, 21, 31, 41, 51 and one or more chip couplers of the first plurality of chip couplers 13, 23, 33, 44, 45, 54, 55, and assembling a second chip coupler on one or more chip couplers of the first plurality of chip couplers 13, 23, 33, 44, 45, 54, 55. Further, assembling the third chip layer on the back side of the second chip layer includes assembling a third chip 35, 43, 53 on one or more second chips 12, 22, 32, 42 of the plurality of second chips 12, 22, 32, 42 and one or more chip couplers of the second plurality of second chip couplers.

In some embodiments, the first plurality of chip couplers 13, 23, 33, 44, 45, 54, 55 include first chip couplers 13, 23, 33, 44, 55 of a first height and second chip couplers 45, 54 of a second height greater than the first height, and wherein assembling the third chip layer on the back side of the second chip layer includes assembling a third chip 35, 43, 53 on one or more second chips 12, 22, 32, 42 of the plurality of second chips and one or more of the second chip couplers 45, 54 of the second height.

According to some embodiments, a chip package comprises a redistribution layer; a first chip 11, 21, 31, 41, 51 having a front side 11a, 21a, 31a, 41a, 51a facing the redistribution layer, a back side facing away from the redistribution layer, and first chip contacts 11c, 21c, 31c, 41c, 51c on the front side of the first chip 11, 21, 31, 41, 51 and coupled to the redistribution layer; one or more first chip connectors 13s, 23, 33s, 44s, 45s, 54, 55 having first connector contacts coupled to the redistribution layer, second connector contacts corresponding to respective ones of the first connector contacts, and through vias between the first connector contacts and respective ones of the second connector contacts; and at least one second chip 12, 22, 32, 42 assembled on the back side of the first chip 11, 21, 31, 41, 51 and having second chip contacts coupled to respective ones of at least a first subset of the second connector contacts, whereby a respective second chip 12, 22, 32, 42 of the at least one second chip is coupled to the redistribution layer via at least one corresponding first chip connector 13s, 23, 33s, 44s, 55 of the one or more first chip connectors.

In some embodiments, the at least one second chip 12, 22, 32, 42 is further assembled on one of the one or more first chip connectors 13s, 23, 33s, 44s, 55. In some embodiments, the respective second chip 12, 22, 32, 42 is soldered to the at least one corresponding first chip connector 13s, 23, 33s, 44s, 55.

In some embodiments, the one or more first chip connectors 13s, 23, 33s, 44s, 45s, 54, 55 include one or more first chip connectors 13s, 23, 33s, 44s, 55 of a first height and one or more first chip connectors 45s, 54 of a second height greater than the first height, and the chip package further comprises at least one third chip 35, 43, 53 having third chip contacts coupled to respective ones of a second subset of the second connector contacts, whereby the at least one third chip 35, 43, 53 is coupled to the redistribution layer via the one or more first chip connectors of the second height.

In some embodiments, the at least one third chip 35, 43, 53 is assembled on the at least one second chip 12, 22, 32, 42 and the one or more first chip connectors of the second height. In some embodiments, the at least one third chip 35, 43, 53 is soldered to the one or more first chip connectors of the second height.

In some embodiments, the chip package further comprises one or more second chip connectors 34s having third connector contacts coupled to a second subset of the second connector contacts, fourth connector contacts corresponding to respective ones of the third connector contacts, and through vias between the third connector contacts and respective ones of the fourth connector contacts; and at least one third chip 35, 43, 53 having third chip contacts coupled to respective ones of at least a subset of the fourth connector contacts, whereby the at least one third chip 35, 43, 53 is coupled to the redistribution layer via the one or more second chip connectors 34 and at least a subset of the one or more first chip connectors 13s, 23, 33s.

In various embodiments of the present invention, the individual chips may be coupled to various circuit structures outside the package using not only chip connectors and/or redistribution layers, but also chip connectors and/or redistribution layers and bumps.

As is well known to those skilled in the art, the contacts or bumps may be made of a conductive material or solder, including Cu, Ni, Au, Ag, etc., or other alloy materials, as well as other materials. In some embodiments, the contacts or bumps may have the form of pads but may have other possible forms.

The foregoing has outlined features of several embodiments so that those skilled in the art may better understand the various aspects of the present invention. Those skilled in the art should appreciate that they may readily use and devise other arrangements and structures that are designed to carry out the same purposes and/or achieve the same advantages of the embodiments described herein as a basis for the present invention. Those skilled in the art should also realize that such equivalent constructions do not depart from the spirit and scope of the present disclosure, and that they may make various changes, substitutions, and alterations herein without departing from the spirit and scope of the present disclosure.

Also, spatially relative terms, such as "below . . . ," "below . . . ," "lower," "above . . . ," "upper," "above . . . ," and the like, may be used herein for ease of description to describe one element or component's relationship to another element or component (or elements) as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly. In addition, herein, the term "assembly" refers to the implementation of circuit coupling between the various electronic devices. The term "chip" may refer to various types of chips, such as logic chips, storage chips, and the like.

It will be understood that, although the terms first, second, etc., are, in some instances, used herein to describe various elements, these elements should not be limited by these terms. These terms are only used to distinguish one element from another. For example, a first UV lamp could be termed a second UV lamp, and, similarly, a second UV lamp could be termed a first UV lamp, without departing from the scope of the various described embodiments. The first widget and the second widget are both widget, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A chip package, comprising:
    a redistribution circuit;
    a stack of chips coupled to the redistribution circuit, the stack of chips including a first chip and one or more second chips, wherein each chip of the stack of chips has a front side facing the redistribution circuit and chip contacts formed on the front side, wherein each chip of the stack of chips further has a backside facing away from the redistribution circuit and no chip contacts formed on the backside;
    one or more first chip connectors, each first chip connector of the one or more first chip connectors having a top side facing away from the redistribution circuit, a bottom side facing the redistribution circuit, and through vias extending through the each first chip connector from the top side to the bottom side;
    wherein:
    the first chip has respective first chip contacts coupled to the redistribution circuit without soldering;
    a respective second chip of the one or more second chips has a first portion assembled on the backside of the first chip and a second portion assembled on the top side of a respective chip connector of the one or more first chip connectors, and the respective second chip has respective second chip contacts disposed on the second portion and coupled to the redistribution circuit via at least some of the through vias in the respective chip connector, wherein at least a portion of the first chip is sandwiched between the first portion of the respective second chip and a portion of the redistribution circuit; and the redistribution circuit is formed on the front side of the first chip and the bottom side of each of the one or more first chip connectors.

2. The chip package of claim 1, wherein the one or more first chip connectors include active coupling devices.

3. The chip package of claim 1, wherein the one or more first chip connectors include one or more first chip connectors of a first height and one or more first chip connectors of a second height greater than the first height, wherein the one or more second chips includes a third chip having third chip contacts coupled to the redistribution circuit via the one or more first chip connectors of the first height, and the one or more second chips further includes a fourth chip having fourth chip contacts coupled to the redistribution circuit via the one or more first chip connectors of the second height.

4. The chip package of claim 1, wherein the chip package further includes one or more second chip connectors, each second chip connector of the one or more second chip connectors having a top side facing away from the redistribution circuit, a bottom side facing the redistribution circuit, and through vias, the each second chip connector being assembled over a respective one of the one or more first chip connectors, wherein the stack of chips further includes a third chip having third chip contacts coupled to the redistribution circuit via at least some of the through vias in at least one of the one or more second chip connectors and some of the vias in at least one of the one or more first chip connectors.

5. The chip package of claim 4, wherein the one or more second chip connectors include active coupling devices.

6. The chip package of claim 4, wherein the one or more first chip connectors include surface traces, and wherein the third chip is coupled to the respective second chip via the one or more second chip connectors and the surface traces.

7. The chip package of claim 4, wherein the one or more second chip connectors and the one or more first chip connectors form one or more chip connector stacks.

8. The chip package of claim 4, wherein each of the one or more second chip connectors is smaller in size from any of the one or more first chip connectors.

9. The chip package of claim 1, further comprising a molding compound encapsulating the stack of chips and the one or more first chip connectors except the front side of the first chip and the bottom side of each of the one or more chip connectors, wherein no portion of the molding compound is disposed between the redistribution circuit and the first chip or between the redistribution layer and the one or more first chip connectors.

10. The chip package of claim 1, wherein:
the one or more first chip connectors includes two first chip connectors;
the first chip is disposed between the two first chip connectors;
the one or more second chips include two second chips, one of the two second chip is coupled to the redistribution circuit via one but not the other of the two first chip connectors, and the other one of the two second chips is coupled to the redistribution circuit via the other but not the one of the two first chip connectors.

11. The chip package of claim 1, wherein the each chip connector of the one or more first chip connectors includes a segment of glass or silicon, and wherein the top side and the bottom side of the each chip connector are first side and second side, respectively, of the segment of glass or silicon, and wherein the through vias extend through the segment of glass or silicon from the first to the second side.

12. A chip package, comprising:
a stack of chips including a first chip and one or more second chips assembled over the first chip such that a front side of the first chip faces away from the one or more second chips and a front side of each of the one or more second chips faces the first chip, the first chip having first chip contacts on the front side of the first chip, each respective second chip of the one or more second chips having respective second chip contacts on the front side of the respective second chip, wherein each chip of the stack of chips further has a backside opposite the front side thereof and no chip contacts formed on the backside;
one or more first chip couplers, each respective first chip coupler of the one or more first chip couplers having a first side, a second side opposite to the first side, respective first coupler contacts on the first side, respective second coupler contacts on the second side, and respective through vias coupling at least some of the respective second coupler contacts to at least some of respective first coupler contacts; and
a redistribution layer formed on the front side of the first chip and the first side of each of the one or more first chip couplers, and coupled to the first chip contacts of the first chip and first coupler contacts of each of the one or more first chip couplers without soldering;
wherein the respective second chip of the one or more second chips has a first portion assembled on the backside of the first chip and a second portion assembled on the second side of at least one of the one or more first chip couplers, and the respective second chip contacts are disposed on the second portion and coupled to the redistribution layer via the at least one of the one or more first chip couplers, and wherein at least a portion of the first chip is sandwiched between the first portion of the respective second chip and a portion of the redistribution layer.

13. The chip package of claim 12, wherein the respective first chip coupler of the one or more first chip couplers includes a segment of glass or silicon, and wherein the first side and the second side of the respective first chip coupler are bottom side and top side, respectively, of the segment or glass of silicon, and wherein the respective through vias extend through the segment of lass or silicon from the top side to the bottom side.

14. The chip package of claim 12, wherein the one or more first chip couplers include active coupling devices.

15. The chip package of claim 12, wherein:
the one or more first chip couplers includes two first chip couplers;
the first chip is disposed between the two first chip couplers;
the one or more second chips include two second chips, one of the two second chip is coupled to the redistribution layer via one but not the other of the two first chip couplers, and the other one of the two second chip is coupled to the redistribution layer via the other but not the one of the two first chip couplers.

16. The chip package of claim 12, further comprising a molding compound encapsulating the stack of chips and the one or more first chip couplers except the front side of the first chip and the first side of each of the one or more first chip couplers, wherein no portion of the molding compound is disposed between the redistribution layer and the first chip or between the redistribution layer and the one or more first chip couplers.

17. A chip package, comprising:
a stack of chips including a first chip and one or more second chips assembled over the first chip such that a front side of the first chip faces away from the one or more second chips and a front side of each of the one or more second chips faces the first chip, the first chip having first chip contacts on the front side of the first chip, each respective second chip of the one or more second chips having respective second chip contacts on the front side of the respective second chip, wherein each chip of the stack of chips further has a backside opposite the front side thereof and no chip contacts formed on the backside;
chip couplers, each respective chip coupler of the chip couplers having a first side, a second side opposite to the first side, respective first coupler contacts on the first side, respective second coupler contacts on the second side, and respective through vias coupling at least some of the respective second coupler contacts to at least some of the respective first coupler contacts; and
a redistribution layer formed on the front side of the first chip and the first side of at least one of the chip couplers, and coupled to the first chip contacts of the first chip and first coupler contacts of the at least one of the chip couplers without soldering;
wherein the respective second chip of the one or more second chips has a first potion assembled on the back side of the first chip and a second portion on the second side of a respective chip coupler of the chip couplers, wherein the respective second chip contacts are disposed on the second portion and coupled to the redistribution layer via the respective chip coupler, and wherein at least a portion of the first chip is sandwiched between the first portion of the respective second chip and a portion of the redistribution layer.

18. The chip package of claim 17, wherein the respective chip coupler includes a segment of glass or silicon, and wherein the first side and the second side of the respective chip coupler are bottom side and top side, respectively, of the segment of glass or silicon, and wherein the respective through vias extend through the segment of glass or silicon from the top side to the bottom side.

19. The chip package of claim 17, wherein the chip couplers include active coupling devices.

20. The chip package of claim 17, wherein:
the chip couplers includes two first chip couplers;
the first chip is disposed between the two first chip couplers;
the one or more second chips include two second chips, one of the two second chip is coupled to the redistribution layer via one but not the other of the two first chip couplers, and the other one of the two second chip is coupled to the redistribution layer via the other but not the one of the two first chip couplers.

21. The chip package of claim 17, further comprising a molding compound encapsulating the stack of chips and the chip couplers except the front side of the first chip and the bottom surface of each of the one or more chip connectors, wherein no portion of the molding compound is disposed between the redistribution layer and the first chip or between the redistribution layer and the at least one of the chip couplers.

* * * * *